(12) United States Patent
Garg et al.

(10) Patent No.: US 9,685,969 B1
(45) Date of Patent: Jun. 20, 2017

(54) TIME-INTERLEAVED HIGH-SPEED DIGITAL-TO-ANALOG CONVERTER (DAC) ARCHITECTURE WITH SPUR CALIBRATION

(71) Applicant: Avago Technologies General IP (Singapore) Pte. Ltd., Singapore (SG)

(72) Inventors: Adesh Garg, Aliso Viejo, CA (US); Ali Nazemi, Aliso Viejo, CA (US); Anand Jitendra Vasani, Laguna Hills, CA (US); Hyo Gyuem Rhew, Irvine, CA (US); Jiawen Zhang, Irvine, CA (US); Jun Cao, Irvine, CA (US); Meisam Honarvar Nazari, Aliso Viejo, CA (US); Afshin Momtaz, Laguna Hills, CA (US); Tamer Ali, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/141,498

(22) Filed: Apr. 28, 2016

Related U.S. Application Data

(60) Provisional application No. 62/318,505, filed on Apr. 5, 2016.

(51) Int. Cl.
*H03M 1/66* (2006.01)
*H03M 1/10* (2006.01)

(52) U.S. Cl.
CPC .......... *H03M 1/1009* (2013.01); *H03M 1/10* (2013.01); *H03M 1/66* (2013.01); *H03M 1/662* (2013.01)

(58) Field of Classification Search
CPC ........ H03M 1/1009; H03M 1/10; H03M 1/66; H03M 1/662
USPC ........................................ 341/120, 144, 155
See application file for complete search history.

(56) References Cited

U.S. PATENT DOCUMENTS

| | | | |
|---|---|---|---|
| 7,148,828 B2* | 12/2006 | Fernandez | H03M 1/10 341/120 |
| 9,030,340 B1* | 5/2015 | Waltari | H03M 1/1245 341/118 |
| 9,106,249 B1* | 8/2015 | Dyer | H03M 1/1004 |
| 9,264,059 B2* | 2/2016 | Tousi | H03M 1/183 |

* cited by examiner

*Primary Examiner* — Brian Young
(74) *Attorney, Agent, or Firm* — Sterne, Kessler, Goldstein & Fox P.L.L.C.

(57) ABSTRACT

A time-interleaved digital-to-analog converter (DAC) architecture is provided. The DAC architecture includes a multiplexer/encoder configured to receive a data signal and to generate a plurality of data streams based on the data signal. First and second DAC circuits receive respective first and second data streams of the plurality of data streams and selectively process the respective first and second data streams to generate a respective DAC output signal. The respective DAC output signals of the first and second DAC circuits are coupled together to provide an output signal of the DAC architecture.

20 Claims, 9 Drawing Sheets

TIME-INTERLEAVED HIGH-SPEED DIGITAL-TO-ANALOG CONVERTER (DAC) ARCHITECTURE WITH SPUR CALIBRATION

CROSS-REFERENCE TO RELATED APPLICATION(S)

This application claims benefit of U.S. Provisional Application No. 62/318,505, filed Apr. 5, 2016, which is incorporated herein by reference in its entirety.

TECHNICAL FIELD

The present disclosure relates generally to time-interleaved digital-to-analog converter (DAC) architectures.

BACKGROUND

High-speed (e.g., multi-gigahertz) and large bandwidth digital-to-analog converters (DACs) are in great demand for a wide variety of broadband communication applications, such as physical layer (PHY) devices, network switches, and microwave wideband data capture. Existing DAC architectures are increasingly unlikely to meet performance demands of these broadband communication applications.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

The present disclosure will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
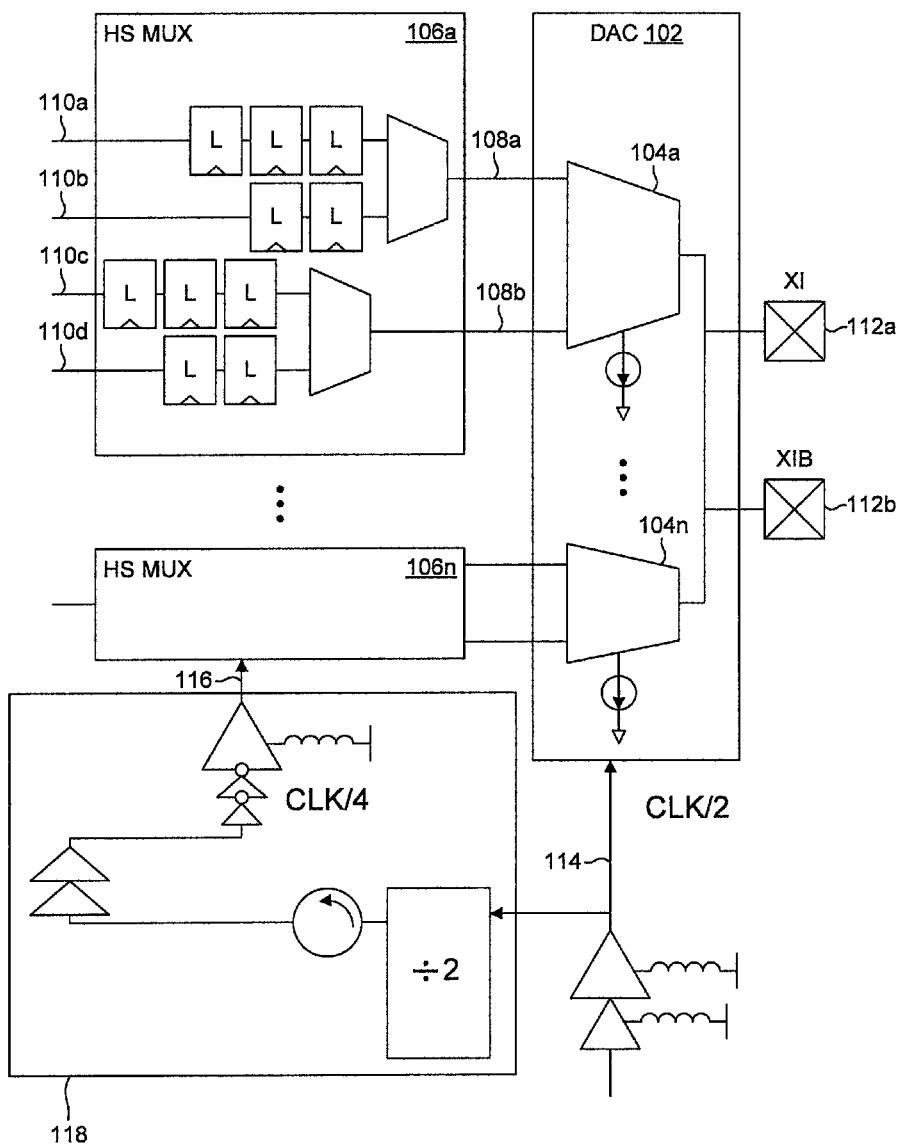
FIG. 1 illustrates an example half-rate digital-to-analog converter (DAC) architecture.

FIG. 1 illustrates an example half-rate digital-to-analog converter (DAC) architecture 100. Example DAC architecture 100 is provided for the purpose of illustration only and is not limiting of embodiments. As shown in FIG. 1, DAC architecture 100 may include a DAC 102 and a plurality of high-speed multiplexers 106a-n.

In an embodiment, high-speed multiplexers 106a-n are each configured to receive a respective plurality of input data signals 110a-d via a plurality of data paths. Within each of high-speed multiplexers 106a-n, input data signals 110a-d are latched by the plurality of data paths and then multiplexed at the output to generate data streams 108a-b. For example, input data signals 110a-b are multiplexed to generate data stream 108a, and input data signals 110c-d are multiplexed to generate data stream 108b. However, embodiments are not limited by this particular processing of input data signals 110a-d to generate data streams 108a-b.

DAC 102 may include a plurality of DAC circuits 104a-n. In an embodiment, the number of DAC circuits 104a-n that are active at any time depends on the value of the digital input being converted to analog. As shown in FIG. 1, DAC circuits 104a-n are each configured to receive respective data streams 108a-b from a respective one of high-speed multiplexers 106a-n. In an embodiment, DAC circuits 104a-n are each clocked and produce an output according to a clock signal 114 having a rate that is one half of an input data rate of DAC architecture 100. As such, DAC circuits 104a-n are referred to as "half-rate." Outputs produced by DAC circuits 104a-n are coupled to produce output signals 112a-b of DAC architecture 100. In an embodiment, output signals 112a-b include a differential output signal.

In another embodiment, DAC circuits 104a-n are each configured to alternate processing between received data streams 108a and 108b at each rising edge and falling edge of clock signal 114. In an embodiment, DAC circuits 104a-n are each implemented to include two DAC sub-circuits (not shown), with each DAC sub-circuit being configured to process a respective one of data streams 108a and 108b. As such, when processing is alternated between data streams 108a and 108b, only one of the two DAC sub-circuits is configured to be in use at any time.

Because DAC circuits 104a-n alternate processing between data streams 108a and 108b, high-speed multiplexers 106a-n should be clocked at a lower rate than DAC circuits 104a-n. In an embodiment, high-speed multiplexers 106a-n are each clocked according to a clock signal 116 having a rate that is one quarter of the input data rate of DAC architecture 100. Typically, as shown in FIG. 1, clock signal 116 is obtained from clock signal 114 using a distribution circuit 118. For example, distribution circuit 118 may include a divider that divides clock signal 114 by two. Distribution circuit 118 may further include phase alignment circuitry for dynamically phase aligning clock signals 114 and 116, which can be a requirement for high performance operation of DAC architecture 100.

In practice, DAC architecture 100 can have several drawbacks. For example, precise phase alignment between clock signals 114 and 116 may be difficult to achieve due to error sensitivity limitations of the phase alignment circuitry. Further, clock distribution limits the scalability and increases the power consumption of DAC architecture 100. Also, at frequencies above 40 GHz, clock distribution becomes extremely challenging due lack of realizable on-chip inductors.

Figure 2:
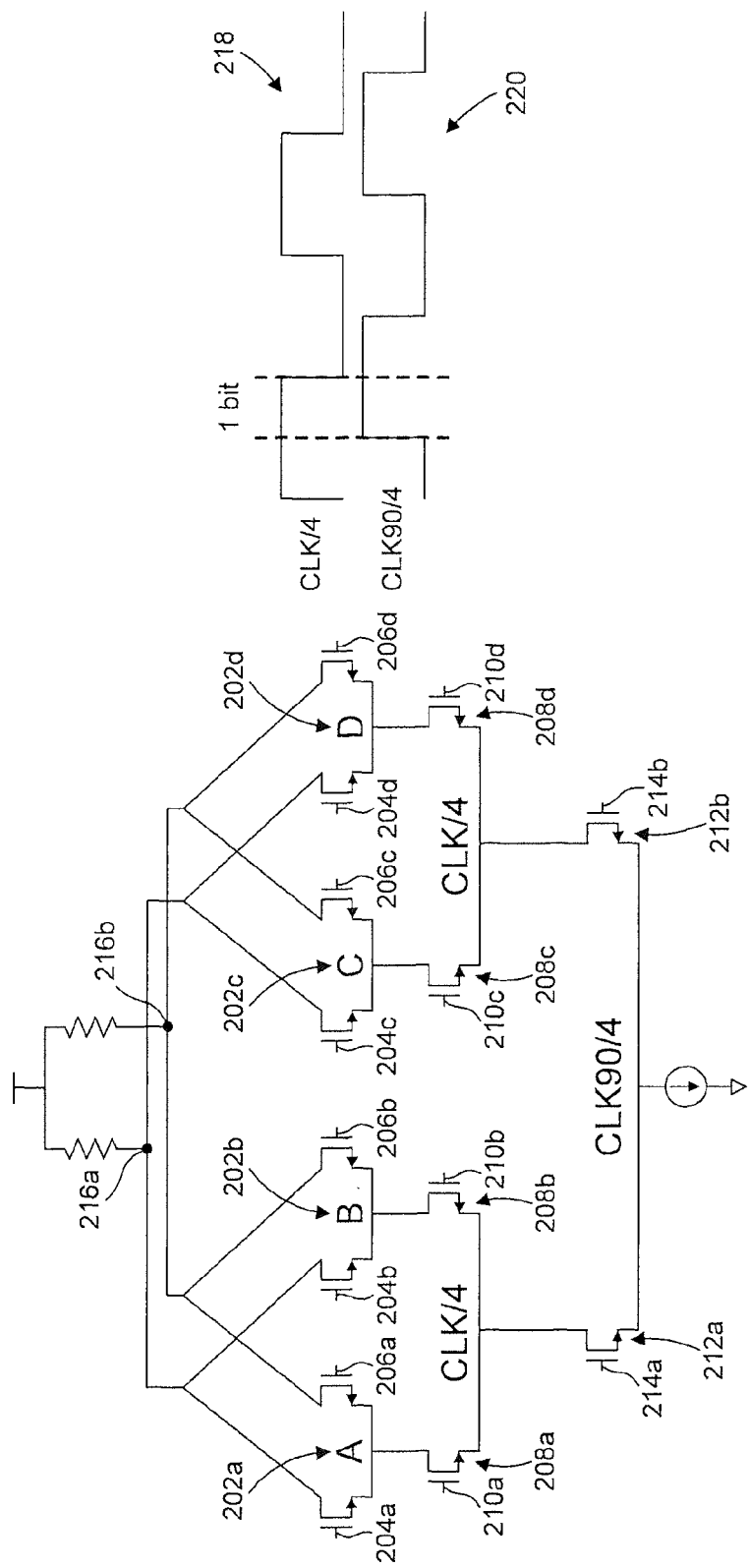
FIG. 2 illustrates an example quarter-rate DAC circuit.

FIG. 2 illustrates an example quarter-rate DAC circuit 200. Example DAC circuit 200 is provided for the purpose of illustration only and is not limiting of embodiments. As shown in FIG. 2, DAC circuit 200 includes a plurality of data input transistor pairs 202a, 202b, 202c, and 202d, a plurality of first stage switching transistors 208a, 208b, 208c, and 208d, and a plurality of second stage switching transistors 212a and 212b.

Data input transistor pairs 202a, 202b, 202c, and 202d are configured to receive respectively data input signal pairs 204a-206a, 204b-206b, 204c-206c, and 204d-206d. In an embodiment, data input signal pairs 204a-206a, 204b-206b, 204c-206c, and 204d-206d each includes a differential signal representing a respective data input stream (referred to as data streams A, B, C, and D in FIG. 2). As such, data input signals 206a, 206b, 206c, and 206d are the negative complements respectively of data input signals 204a, 204b, 204c, and 204d. In another embodiment, data input signal pairs 204a-206a, 204b-206b, 204c-206c, and 204d-206d each includes a single-ended signal representing a respective data input stream. As such, within each data input transistor pair 202a-d, one of the data input transistors is grounded for the single-ended embodiment, while the data input signal is applied to the other data input transistor.

As shown in FIG. 2, data input transistors receiving data input signals 204a, 204b, 204c, and 204d are coupled together by their respective drain terminals to provide output terminal 216a. Similarly, data input transistors receiving data input signals 206a, 206b, 206c, and 206d are coupled together by their respective drain terminals to provide output terminal 216b. Output terminals 216a-216b provide the output of DAC circuit 200.

First stage switching transistors 208a, 208b, and 208c, and 208d are controlled respectively by control signals 210a, 210b, 210c, and 210d. In an embodiment, control signal pairs 210a-b and 210c-d each includes a differential representation of a clock signal 218. In an embodiment, clock signal 218 has a rate that is equal to one fourth of an input data rate of DAC circuit 200. In another embodiment, clock signal 218 has a rate that is equal to (n/m) times the input data rate of DAC circuit 200, where n and m are integers and n is lower than m.

Second stage switching transistors 212a and 212b are controlled respectively by control signals 214a and 214b. In an embodiment, control signals 214a and 214b include a differential representation of a clock signal 220. In an embodiment, as shown in FIG. 2, clock signal 220 is a 90 degrees shifted version of clock signal 218. Clock signal 220 thus has the same rate as clock signal 218.

In an embodiment, data streams A, B, C, and D are each of equal rate to clock signal 218. As such, the data in data streams A, B, C, and D remains stable over the duration of an entire period (e.g., from rising edge to rising edge or from falling edge to falling edge) of clock signal 218. As such, in an embodiment, within each period of clock signal 218 (or clock signal 220), the output of DAC circuit 200 may be configured to sequentially cycle between (or multiplex) data input streams A, B, C, and D (represented by data input signal pairs 204a-206a, 204b-206b, 204c-206c, and 204d-206d respectively). For example, in an embodiment, in a first bit interval, a clock period of clock signal 218 may begin with both clock signals 218 and 220 in a logic high state. This results in both switching transistors 208a and 212a being turned on and data stream A being coupled to output terminals 216a and 216b. In the next bit interval, clock signal 218 transitions to a logic low, causing switching transistor 208a to turn off and switching transistor 208b to turn on. This couples data stream B to output terminals 216a and 216b.

Clock signal 220 then transitions to a logic low in the next bit interval. As a result, switching transistor 212a turns off and switching transistor 212b turns on. In an embodiment, this leads to data stream C being coupled to output terminals 216a and 216b. Finally, when clock signal 218 returns to a logic high, switching transistor 208c turns off and switching transistor 208d turns on, coupling data stream D to output terminals 216a and 216b. The same operation described above repeats for the next clock cycle with clock signal 220 returning to a logic high.

According to the operation described above, each time that an output transition occurs due to a transition of clock signal 220, one of first stage switching transistors 208a-d turns on and another turns off, and also one of second stage switching transistors 212a-b turns on and the other turns off. Unless very fast transistor settling can be realized, output errors can result from this multi-stage transistor switching operation. Output errors may also result in DAC circuit 200 without very precise alignment between clock signal 218 and its quadrature counterpart clock signal 220. Correction circuits may be used to reduce output errors, but come with the cost of increasing input and output loading of DAC architecture 100. This reduces the desirability of DAC circuit 200 for very high-speed applications.

Figure 3:
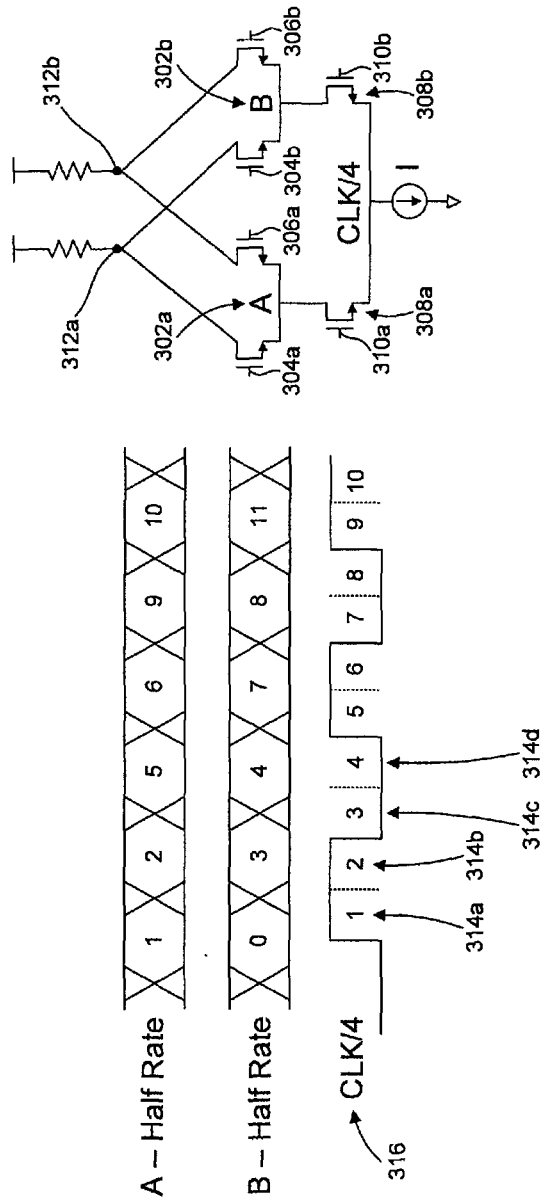
FIG. 3 illustrates another example quarter-rate DAC circuit.

FIG. 3 illustrates another example quarter-rate DAC circuit 300. Example DAC circuit 300 is provided for the purpose of illustration only and is not limiting of embodiments. As shown in FIG. 3, DAC circuit 300 includes data input transistor pairs 302a and 302b and switching transistors 308a and 308b.

Data input transistor pairs 302a and 302b are configured to receive respectively data input signal pairs 304a-306a and 304b-306b. In an embodiment, data input signal pairs 304a-306a and 304b-306b each includes a differential signal representing a respective data input stream (referred to as data streams A and B in FIG. 3). As such, data input signals 306a and 306b are the negative complements respectively of data input signals 304a and 304b. In another embodiment, data input signal pairs 304a-306a and 304b-306b each includes a single-ended signal representing a respective data input stream. As such, within each data input transistor pair 302a-b, one of the data input transistors is grounded for the single-ended embodiment, while the data input signal is applied to the other data input transistor.

As shown in FIG. 3, data input transistors receiving data input signals 304a and 304b are coupled together by their respective drain terminals to provide output terminal 312a. Similarly, data input transistors receiving data input signals 306a and 306b are coupled together by their respective drain terminals to provide output terminal 312b. Output terminals 312a-b provide the output of DAC circuit 300.

Switching transistors 308a and 308b are controlled respectively by control signals 310a and 310b. In an embodiment, control signals 310a-b together include a differential representation of a clock signal 316. In an embodiment, clock signal 316 has a rate that is equal to one fourth of an input data rate of DAC circuit 300. In another embodiment, clock signal 316 has a rate that is equal to (n/m) times the input data rate of DAC circuit 300, where n and m are integers and n is lower than m.

In an embodiment, data streams A and B are each of twice the rate of clock signal 316 (or one half of the input data rate of DAC circuit 300). As such, the data in data streams A and B remains stable over the duration of a half period (e.g., from rising edge to falling edge or from falling edge to rising edge) of clock signal 316, and thus transitions from one data value to another at least once within a period of clock signal 316. As such, in an embodiment, within a given period of clock signal 316, the output of DAC circuit 300 may be configured to sequentially cycle between (or multiplex) data input streams A and B. In addition, within each half of the given period, the output of DAC circuit 300 may be further configured to transition from one data value to another of the same bit stream being passed to the output during the half period.

An example illustrating this operation of DAC circuit 300 is provided in FIG. 3. As shown, data streams A and B are of twice the rate of clock signal 316. In other words, the data in each of data streams A and B remains stable for a duration equal to a half of the period of clock signal 316. In an embodiment, in a given clock cycle beginning with clock signal 316 transitioning to a logic high, switching transistor 308a is turned on and switching transistor 308b is turned off. This couples data stream A to output terminals 312a-b and results in the data value numbered "1" of data stream A being reflected at the output of DAC circuit 300 during a first bit interval 314a.

At the end of first bit interval 314a, a data transition occurs in data stream A from the data value "1" to the data value "2." This data transition is illustrated by the dotted line between first bit interval 314a and a second bit interval 314b, and results in the data value numbered "2" of data stream A being reflected at the output of DAC circuit 300 during second bit interval 314b.

At the end of second bit interval 314b, clock signal 316 transitions from a logic high to a logic low. This results in switching transistor 308a being turned off and switching transistor 308b being turned on, coupling data stream B to the output. As such, in a third bit interval 314c, the data value numbered "3" of data stream B is reflected at the output of DAC circuit 300. Next, a data transition occurs in data stream B at the end of third bit interval 314c, and the data value numbered "4" of data stream B is reflected at the output of DAC circuit 300 during a fourth bit interval 314d. The same operation described above repeats in the next clock cycle with clock signal 316 returning to a logic high state at the end of fourth bit interval 314d.

It is noted that within a given clock cycle, DAC circuit 300 multiplexes the same number of input data values as DAC circuit 200 described above. For example, where DAC circuit 200 sequentially cycles between data streams A, B, C, and D to provide four output data values in a clock cycle, the same data output rate is generated by DAC circuit 300 multiplexing data streams A and B (in the sequence A, A, B, B). However, by relying on the transitions in the input data streams A and B as described above, DAC circuit 300 requires a single transistor switching stage, which reduces output errors compared to DAC circuit 200. However, by still relying on complete switching between multiple paths (e.g., from data stream A to data stream B, and vice versa) to generate the output, DAC circuit 300 may still suffer from output errors due to slow settling performance. Further, in order to accurately capture the data from data streams A and B, clock signal 316 and the data streams A and B must be tightly aligned. For instance, as illustrated in the example of FIG. 3, it is desirable that transitions (rising and falling edges) of clock signal 316 align with the middle of the data stream value being sampled.

Figure 4:
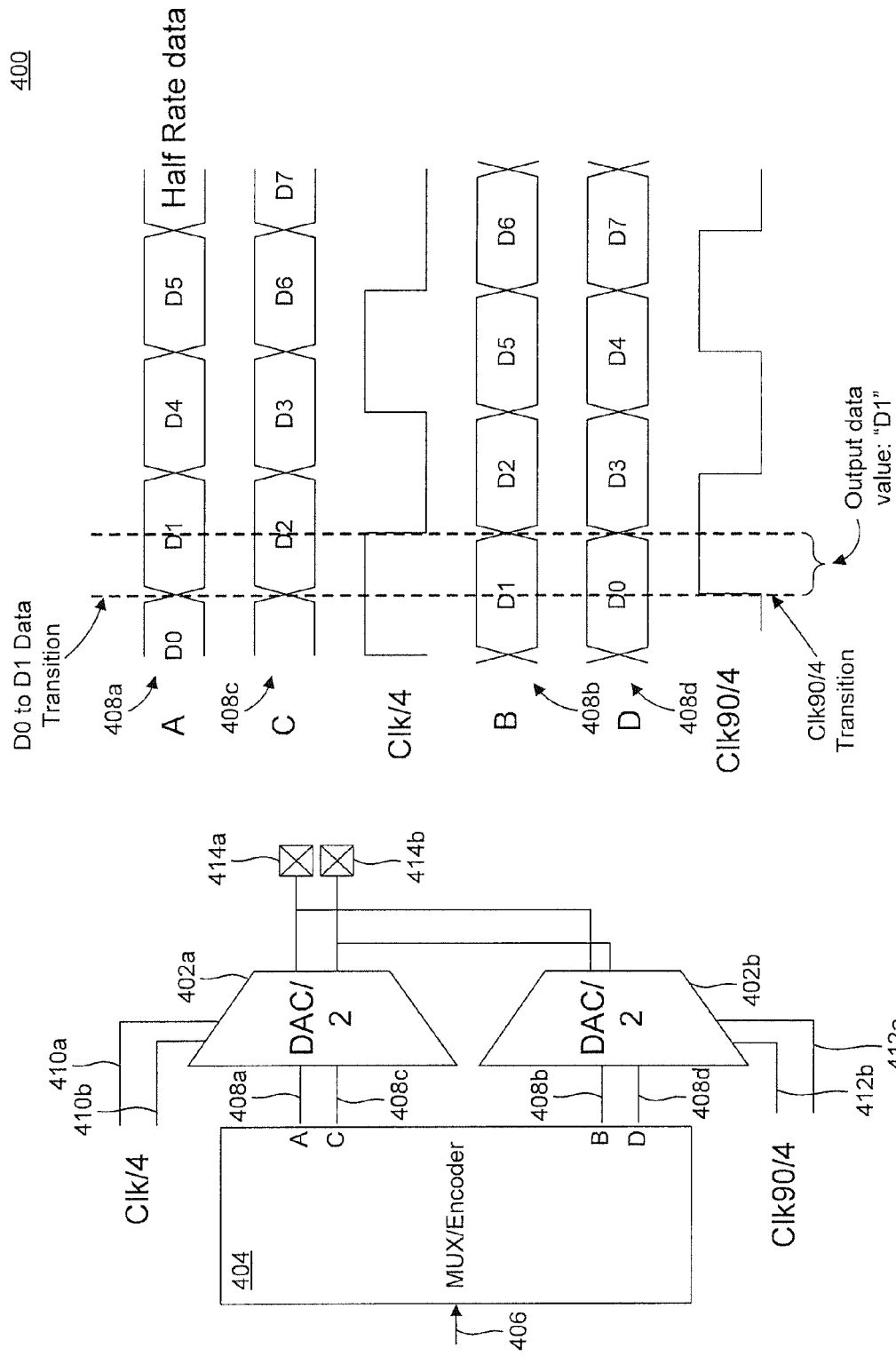
FIG. 4 illustrates an example blended quarter-rate DAC architecture.

FIG. 4 illustrates an example blended quarter-rate DAC architecture 400 according to an embodiment. Example DAC architecture 400 is provided for the purpose of illustration only. As shown in FIG. 4, DAC architecture 400 includes a plurality of DACs 402a and 402b and a multiplexer/encoder 404. In other embodiments, DAC architecture 400 may include more than two DACs 402.

In an embodiment, mutiplexer/encoder 404 is configured to receive a data signal 406 and to generate data streams 408a, 408b, 408c, and 408d. In an embodiment, each of data streams 408a, 408b, 408c, and 408d has a data rate equal to a half of an input data rate of DAC architecture 400. As further described below, in an embodiment, multiplexer/encoder 404 generates data streams 408a, 408b, 408c, and 408d by encoding data signal 406.

In an embodiment, DAC 402a is configured to receive data streams 408a and 408c, and DAC 402b is configured to receive data streams 408b and 408d. DAC 402a is clocked by a clock pair 410a-b. DAC 402b is clocked by a clock pair 412a-b, a 90 degrees shifted version of clock pair 410a-b, thereby DACs 402a and 402b are time-interleaved. In an embodiment, clock pairs 410a-b and 412a-b each include a quarter-rate clock signal, i.e., the rate of the clock signal is one quarter of an input data rate of DAC architecture 400.

In an embodiment, DACs 402a and 402b are each implemented like example DAC circuit 300 described above. As such, in accordance with the operation of DAC circuit 300 described above, in an embodiment, each of DACs 402a and 402b is configured to couple/multiplex its respective input data streams to its output at both clock transitions (e.g., rising and falling edges) as well as data transitions occurring between clock transitions. For example, in a given cycle of clock pair 410a-b, DAC 402a may be configured to process a first data value from data stream 408a (stream A), then transition to processing a second data value of data stream 408a upon a data transition in data stream 408a. Then, in response to a clock transition of clock pair 410a-b, DAC 402a switches to processing a third data value from data stream 408c (stream C), before transitioning to processing a fourth data value from data stream 408c in response to a data transition in data stream 408c.

In an embodiment, DACs 402a and 402b jointly generate outputs 414a-b of DAC architecture 400. More specifically, each output data value represented by outputs 414a-b is contributed by both DAC 402a and DAC 402b. This operation requires that data streams 408a-d be configured such that whenever any two data streams (e.g., data streams 408a and 408b, or data streams 408c and 408d, etc.) are processed simultaneously to the output, the two data streams hold the same input data value for the entire output data value duration. In an embodiment, data streams 408a-d are generated by encoding data signal 406 to produce the necessary configuration. By having every output data value result from two distinct paths simultaneously, output errors due to particular paths can be averaged out.

An example illustrating this operation is provided in FIG. 4 using example data streams 408a, 408b, 408c, and 408d (referred to as data streams A, B, C, and D in FIG. 4). As shown, for each bit interval, the output data value is due to DAC 402a coupling one of data streams 408a and 408c to the output and DAC 402b coupling one of data streams 408b and 408d to the output. Specifically, the output data value "D1" is contributed by DAC 402a coupling data stream 408a to outputs 414a-b in response to the D0 to D1 data transition in data stream 408a (while clock pair 410a-b remains high) and also by DAC 402b coupling data stream 408b to outputs 414a-b in response to clock pair 412a-b transitioning from a logic low to a logic high. For the next output data value "D2," clock pair 410a-b undergoes a high to low transition, which results in DAC 402a coupling data stream 408c to outputs 414a-b. Concurrently, data stream 408b undergoes a data transition from "D1" to "D2" and continues to be coupled to outputs 414a-b by DAC 402b. The next output data value "D3" is contributed by DAC 402a continuing to couple data stream 408c to outputs 414a-b, with data stream 408c undergoing a data transition from "D2" to "D3." The output data value "D3" is also contributed by DAC 402b switching from coupling data stream 408b to coupling data stream 408d in response to clock pair 412a-b transitioning from a logic high to a logic low. Then, for the next output data value "D4," clock pair 412a-b transitions from a logic low to a logic high, which results in DAC 402a switching from coupling data stream 408c to coupling data stream 408a to outputs 414a-b. Concurrently, data stream 408d undergoes a data transition from "D3" to "D4" and continues to be coupled by DAC 402b to outputs 414a-b. The example cycle described above repeats, with output data value "D5" being generated in a similar fashion as described above for output data value "D1."

Figure 5:
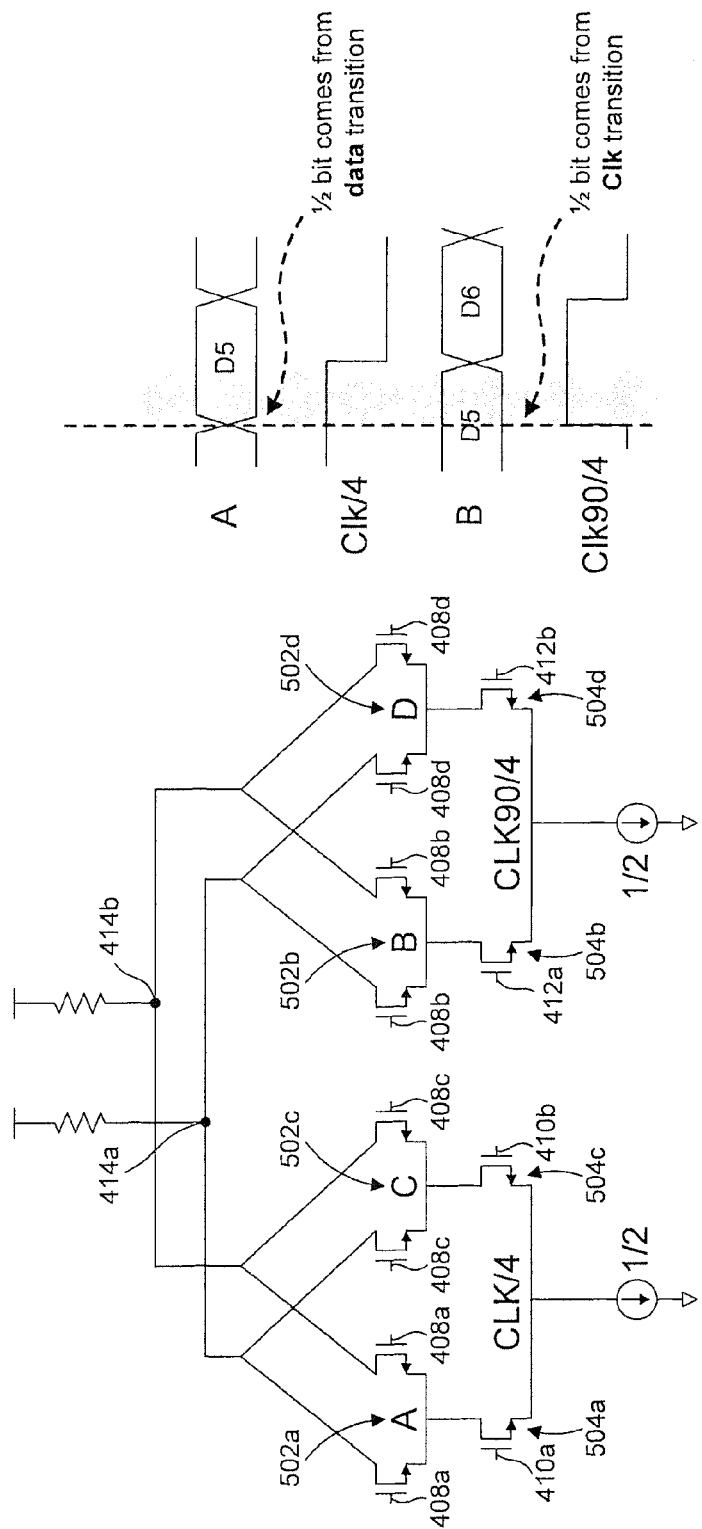
FIG. 5 illustrates an example blended quarter-rate DAC circuit.

FIG. 5 illustrates an example blended quarter-rate DAC circuit 500. Example DAC circuit 500 is provided for the purpose of illustration only and is not limiting of embodiments. As shown in FIG. 5, DAC circuit 500 includes a plurality of data input transistor pairs 502a, 502b, 502c, and 502d and a plurality of switching transistors 504a, 504b, 504c, and 504d.

In an embodiment, DAC circuit 500 may implement DAC architecture 400 described above. For example, data input transistor pairs 502a and 502c and switching transistors 504a and 504c may be configured to implement DAC 402a, and data input transistor pairs 502b and 502d and switching transistors 504b and 504d may configured to implement DAC 402b. As such, data input transistor pairs 502a, 502b, 502c, and 502d may be configured to receive respectively data streams 408a, 408b, 408c, and 408d discussed above. Switching transistors 504a and 504c may be controlled by clock pair 410a-b, and switching transistors 504b and 504d may be controlled by clock pair 412a-b.

Operation of DAC circuit 500 can be as described above with respect to DAC architecture 400. This results in, at every bit interval (corresponding to one fourth of a clock period), one of data streams 408a and 408c and one of data streams 408b and 408d being simultaneously processed to the output of DAC circuit 500. For example, in an embodiment, DAC circuit 500 couples to the output sequentially data streams 408a and 408b, data streams 408c and 408b, data streams 408c and 408d, and data streams 408a and 408d.

Figure 6:
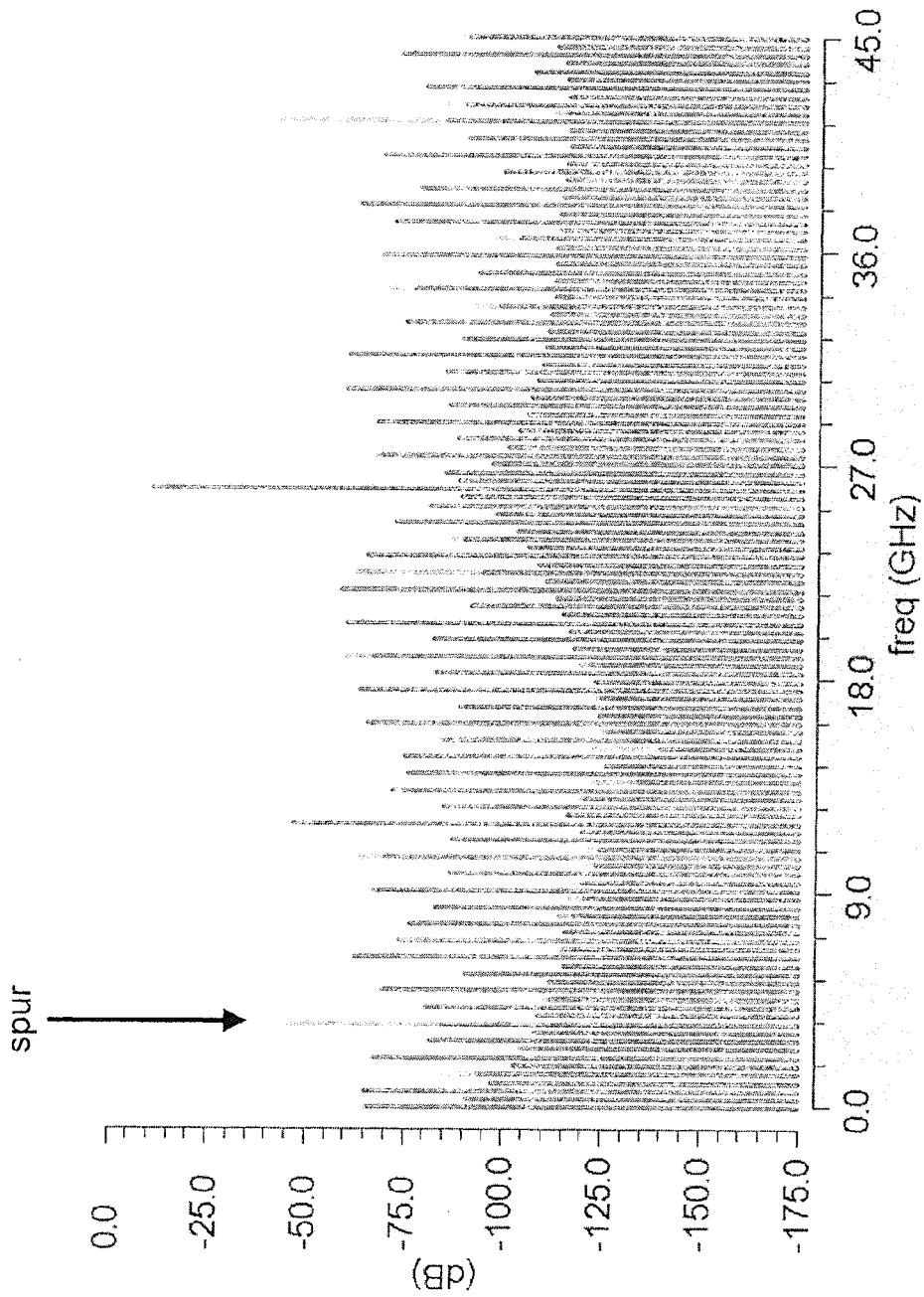
FIG. 6 illustrates an example frequency spectrum of a time-interleaved DAC output.

Time-interleaved DAC architectures as described above may suffer from clock phase mismatch between the time-interleaved clocks as the output frequency increases toward Nyquist frequency. Typically, the mismatch results in spurs being generated at known frequencies in the DAC output as illustrated in FIG. 6. These spurs often limit the overall effective number of bits (ENOB) of the DAC. Because the frequencies of the generated spurs are generally known, the spurs can be reduced or eliminated by calibration.

Figure 7:
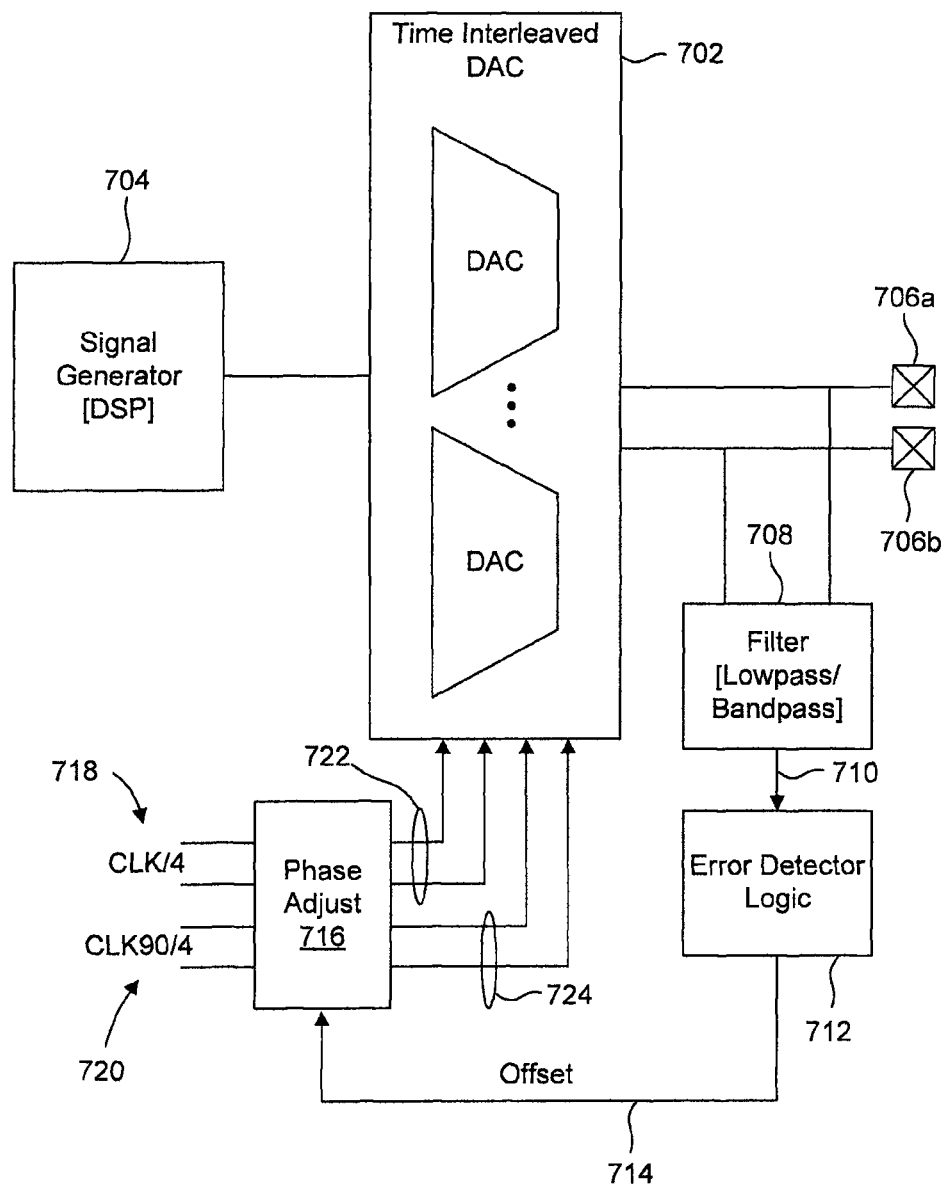
FIG. 7 illustrates an example calibration arrangement for a time-interleaved DAC circuit.

FIG. 7 illustrates an example calibration arrangement 700 for calibrating a time-interleaved DAC. Example calibration arrangement 700 is provided for the purpose of illustration only and is not limiting of embodiments. As shown in FIG. 7, calibration arrangement 700 includes a digital signal generator (DSP) 704 configured to apply a training signal to a DAC 702. DAC 702 is a time-interleaved DAC controlled by time-interleaved clock signals 722 and 724. Time-interleaved clock signals 722 and 724 are generated by phase adjusting time-interleaved clock signals 718 and 720 using a phase adjustment circuit 716.

Output terminals 706a and 706b provide an output signal of DAC 702 in response to the training signal applied by DSP 704. In an embodiment, a filter 708, such as a low-pass or a band-pass filter, filters the output signal of DAC 702 to isolate spurs and provides a filtered output signal 710 to an error detection logic 712. Error detection logic 712 can be a circuit or a processor configured to perform the functionality described herein. In an embodiment, error detection logic 712 can include an analog-to-digital converter (ADC). In an embodiment, filter 708 and error detection logic 712 may be located outside of the DAC chip.

Error detection logic 712 is configured to detect a spur in the output signal of DAC 702. In response to detecting a spur, error detection logic 712 generates a control signal 714 for phase adjustment circuit 716. In response to control signal 714, phase adjustment circuit 716 adjusts a phase offset between time-interleaved clock signals 718 and 720 to reduce a phase mismatch between time-interleaved clocks 722 and 724. As a result of reducing the phase mismatch, the detected spur magnitude is reduced.

Calibration as described above can be repeated as much as needed to sufficiently reduce or eliminate any detected spurs. In embodiments, calibration can be performed at DAC start up or periodically during operation. In addition to being performed using a training signal, calibration may also be performed on the fly using real time data.

Figure 8:
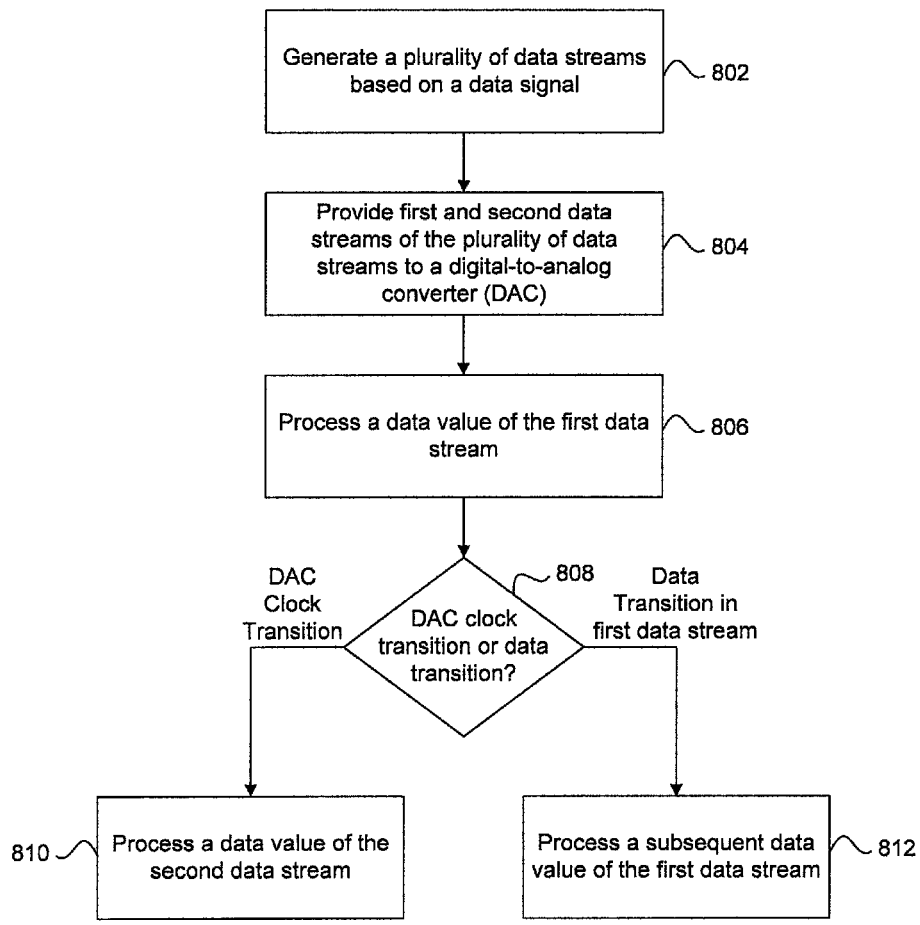
FIG. 8 illustrates an example process according to an embodiment.

FIG. 8 illustrates an example process 800 according to an embodiment. Example process 800 is provided for the purpose of illustration only and is not limiting of embodiments. Process 800 can be performed by a DAC circuit having an architecture or circuitry as described above in FIGS. 4 and 5, for example.

As shown in FIG. 8, process 800 begins in step 802, which includes generating a plurality of data streams based on a data signal. In an embodiment, step 802 includes encoding the data signal to generate the plurality of data streams. For example, the data signal may be encoded to generate data streams such as data streams 408a, 408b, 408c, and 408d, where a desired data output value is provided in at least two of the generated data streams concurrently such that the at least two data streams can jointly contribute the desired data output value to the output. As would be understood by a person of skill in the art, embodiments are not limited to generating only four data streams from the data signal as described above. In other embodiments, more than four (e.g., 8, 16, etc.) data streams can be generated.

Step 804 includes providing first and second data streams of the plurality of data streams to a DAC. For example, step 804 may be equivalent to providing data streams 408a and 408c to DAC 402a or providing data streams 408b and 408d to DAC 402b. As would be understood by a person of skill in the art based on the teachings herein, step 804 may be performed for multiple DACs (e.g., 2, 4, etc.) in parallel, with each DAC provided a respective first and second data streams of the plurality of data streams. In other embodiments, a DAC may be provided more than two data streams (e.g., 4, 8, etc.) of the plurality of data streams.

Subsequently, step 806 includes processing a data value of the first data stream. In an embodiment, step 806 is performed at least in part by the DAC receiving the first and second data streams. The output of the DAC, responsive to processing the data value, is coupled to an output of the DAC circuit in a first bit interval.

Then, in block 808, a clock signal that controls the DAC undergoes a clock transition or the first data stream undergoes a data transition. In an embodiment, the event in block 808 occurs at the end of the first bit interval. Depending on whether a clock transition or a data transition occurs in block 808, process 800 proceeds to either step 810 or step 812. If a clock transition takes place, process 800 proceeds to step 810, which includes processing a data value of the second data stream provided to the DAC. The output of the DAC circuit thus reflects the processing of the data value of the second data stream in a second bit interval.

Otherwise, if the first data stream undergoes a data transition (before a clock transition occurs), then process 800 proceeds to step 812, which includes processing a subsequent data value (subsequent to the data value processed in step 806) of the first data stream. The output of the DAC circuit thus reflects the processing of the subsequent data value of the first data stream in the second bit interval.

Figure 9:
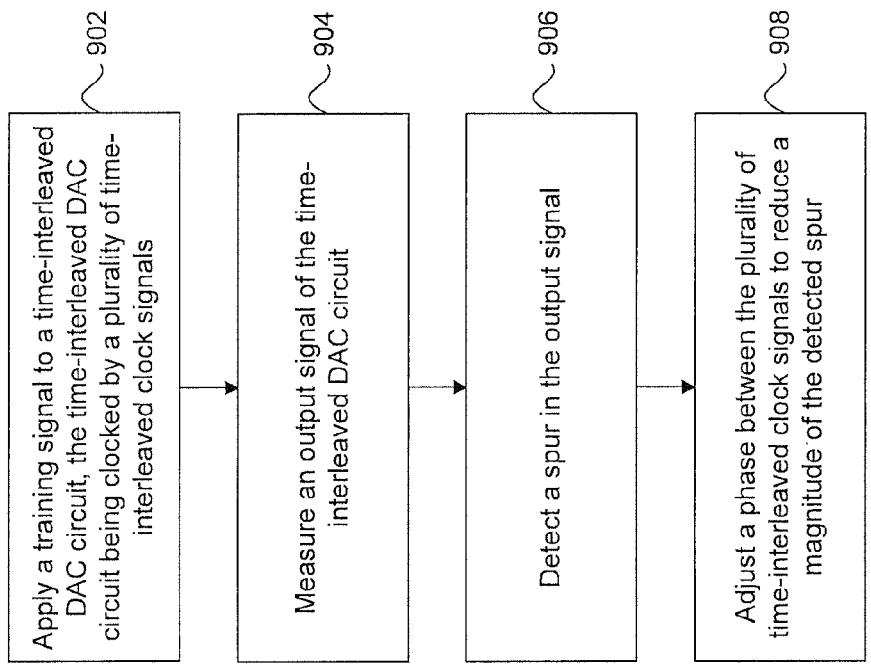
FIG. 9 illustrates another example process according to an embodiment.

FIG. 9 illustrates another example process 900 according to an embodiment. Example process 900 is provided for the purpose of illustration only and is not limiting of embodiments. Process 900 can be performed by a calibration arrangement such as calibration arrangement 700, for example, to calibrate a time-interleaved DAC circuit clocked by a plurality of time-interleaved clock signals.

As shown in FIG. 9, process 900 begins in step 902, which includes applying a training signal to the time-interleaved DAC circuit. In an embodiment, step 902 can be performed by a digital signal generator DSP.

Subsequently, step 904 includes measuring an output signal of the time-interleaved DAC circuit in response to the training signal, and step 906 includes detecting a spur in the output signal of the time-interleaved DAC circuit. In an embodiment, step 904 can be performed by a low-pass or a band-pass filter such as filter 708. Step 906 can be performed by an error detector logic, such as error detector logic 712.

Finally, step 908 includes adjusting a phase between the plurality of time-interleaved clock signals to reduce a magnitude of the detected spur. In an embodiment, step 908 can be performed by a phase adjustment circuit, such as phase adjustment circuit 716.

For the purposes of this discussion, the term "processor circuitry" shall be understood to include one or more: circuit(s), processor(s), or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to embodiments described herein. Alternatively, the processor can access an internal or external memory to retrieve instructions stored in the memory, which when executed by the processor, perform the corresponding function(s) associated with the processor.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments as other embodiments will be apparent to a person of skill in the art based on the teachings herein.

What is claimed is:

1. A digital-to-analog converter (DAC) circuit, comprising:
   a multiplexer/encoder configured to receive a data signal and to generate a plurality of data streams based on the data signal;
   first and second DACs each configured to receive respective first and second data streams of the plurality of data streams and to selectively process the respective first and second data streams to generate a respective DAC output signal,
   wherein at least one of the first and second DACs is further configured to:
      transition from processing a first data value of the respective first data stream to processing a second data value of the respective second data stream in response to a clock transition of a respective clock signal; and
      transition from processing a third data value of the respective first data stream to processing a fourth data value of the respective first data stream in response to a data transition of the respective first data stream from the third data value to the fourth data value.

2. The DAC circuit of claim 1, wherein the clock transition of the respective clock signal includes a rising edge transition or a falling edge transition.

3. The DAC circuit of claim 1, wherein a rate of the respective clock signal is (n/m) times a data rate of the data signal, where n and m are integers.

4. The DAC circuit of claim 3, wherein n is lower than m.

5. The DAC circuit of claim 1, wherein the respective DAC output signal of the first DAC and the respective DAC output signal of the second DAC are coupled to provide an output signal of the DAC circuit.

6. The DAC circuit of claim 5, wherein an output data value represented by the output signal of the DAC circuit is responsive to the first DAC transitioning from processing the first data value of the respective first data stream to processing the second data value of the respective second data stream and the second DAC transitioning from processing the third data value of the respective first data stream to processing the fourth data value of the respective first data stream.

7. The DAC circuit of claim 6, wherein the multiplexer/encoder is further configured to encode the data signal to generate the plurality of data streams.

8. The DAC circuit of claim 7, wherein the multiplexer/encoder is further configured to encode the data signal such that the second data value of the respective second data stream of the first DAC holds an equal value to the fourth data value of the respective first data stream of the second DAC.

9. The DAC circuit of claim 5, wherein an output data value represented by the output signal of the DAC circuit is responsive to the clock transition of the respective clock signal of the first DAC and the data transition of the respective first data stream of the second DAC.

10. A method for processing data, comprising:
  generating a plurality of data streams based on a data signal;
  providing, to each of first and second digital-to-analog converters (DACs), respective first and second data streams of the plurality of data streams;
  selectively processing the respective first and second data streams to generate a respective DAC output signal by each of the first and second DACs,
  wherein selectively processing the respective first and second data streams comprises:
    transitioning from processing a first data value of the respective first data stream to processing a second data value of the respective second data stream in response to a clock transition of a respective clock signal; and
    transitioning from processing a third data value of the respective first data stream to processing a fourth data value of the respective first data stream in response to a data transition of the respective first data stream from the third data value to the fourth data value.

11. The method of claim 10, wherein the clock transition of the respective clock signal includes a rising edge transition or a falling edge transition.

12. The method of claim 10, wherein a rate of the respective clock signal is (n/m) times a data rate of the data signal, where n and m are integers.

13. The method of claim 12, wherein n is lower than m.

14. The method of claim 10, further comprising coupling the respective DAC output signal of the first DAC and the respective DAC output signal of the second DAC to provide an output signal.

15. The method of claim 14, wherein an output data value represented by the output signal is responsive to the first DAC transitioning from processing the first data value of the respective first data stream to processing the second data value of the respective second data stream and the second DAC transitioning from processing the third data value of the respective first data stream to processing the fourth data value of the respective first data stream.

16. The method of claim 15, further comprising encoding the data signal to generate the plurality of data streams.

17. The method of claim 16, wherein encoding the data signal comprises encoding the data signal such that the second data value of the respective second data stream of the first DAC holds an equal value to the fourth data value of the respective first data stream of the second DAC.

18. The method of claim 14, wherein an output data value represented by the output signal is responsive to the clock transition of the respective clock signal of the first DAC and the data transition of the respective first data stream of the second DAC.

19. A method for calibrating a time-interleaved digital-to-analog converter (DAC) circuit, comprising:
  applying a training signal to a time-interleaved DAC circuit, the time-interleaved DAC circuit being clocked by a plurality of time-interleaved clock signals;
  measuring an output signal of the time-interleaved DAC circuit in response to the training signal;
  detecting a spur in the output signal responsive to the measuring; and
  adjusting a phase between the time-interleaved clock signals to reduce a magnitude of the detected spur.

20. The method of claim 19, wherein detecting the spur in the output signal comprises filtering, using a low-pass filter or a band-pass filter, the output signal to isolate the spur.

* * * * *